United States Patent
Abe et al.

(10) Patent No.: US 9,327,364 B2
(45) Date of Patent: *May 3, 2016

(54) SOLDER PIECE, CHIP SOLDER AND METHOD OF FABRICATING SOLDER PIECE

(71) Applicant: Senju Metal Industry Co., Ltd., Tokyo (JP)

(72) Inventors: Masahiko Abe, Tochigi (JP); Koji Watanabe, Tochigi (JP); Hideaki Takahashi, Tochigi (JP); Masahiko Kanno, Tochigi (JP); Masaya Ito, Tochigi (JP)

(73) Assignee: Senju Metal Industry Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/598,007

(22) Filed: Jan. 15, 2015

(65) Prior Publication Data

US 2015/0122874 A1 May 7, 2015

Related U.S. Application Data

(62) Division of application No. 13/501,746, filed as application No. PCT/JP2011/072622 on Sep. 30, 2011, now Pat. No. 8,991,679.

(51) Int. Cl.
*B23K 35/00* (2006.01)
*B23K 35/02* (2006.01)
(Continued)

(52) U.S. Cl.
CPC ............ *B23K 35/0222* (2013.01); *B23K 1/008* (2013.01); *B23K 1/0016* (2013.01);
(Continued)

(58) Field of Classification Search
CPC ........... B23K 2201/42; B23K 2201/40; B23K 35/0227; B23K 35/0238; B23K 35/26; B23K 35/262; B23K 35/286; B23K 35/302; B23K 35/3033; B23K 35/325; B23K 3/0607; B23K 3/0638; B23K 3/08
See application file for complete search history.

(56) References Cited

U.S. PATENT DOCUMENTS

| 4,712,721 A | 12/1987 | Noel et al. |
| 6,426,564 B1 | 7/2002 | Ball |

(Continued)

FOREIGN PATENT DOCUMENTS

| JP | 61-172697 | 8/1986 |
| JP | 64-011095 | 1/1989 |

(Continued)

OTHER PUBLICATIONS

Extended European Search Report for Application No. 11 808 554.7, dated Jun. 1, 2015, 6 pgs.

*Primary Examiner* — Erin Saad
(74) *Attorney, Agent, or Firm* — Chernoff, Vilhauer, McClung & Stenzel, LLP

(57) ABSTRACT

A solder piece that has a rectangular parallelepiped shape formed by a punching process. Any one of the four surfaces of the rectangular parallelepiped other than the surface on which the shear droop portion generated by the punching process is formed and a surface opposite to the surface on which the shear droop portion is formed is a vacuum pickup surface. Each vacuum pickup surface is a sheared surface and extends along a longitudinal direction of the rectangular parallelepiped solder piece. The solder piece may be located in an open cavity in a supply tape with one of only the four vacuum pickup surfaces exposed to be available for vacuum pickup.

3 Claims, 5 Drawing Sheets

(51) Int. Cl.
  *B23K 35/14*   (2006.01)
  *B23K 35/30*   (2006.01)
  *B23K 35/26*   (2006.01)
  *B23K 35/28*   (2006.01)
  *B23K 35/32*   (2006.01)
  *B23K 35/40*   (2006.01)
  *B23K 1/00*    (2006.01)
  *B23K 1/008*   (2006.01)
  *B23K 3/06*    (2006.01)
  *H05K 3/34*    (2006.01)
  *B26F 1/02*    (2006.01)

(52) U.S. Cl.
  CPC ............... *B23K3/0623* (2013.01); *B23K 35/02* (2013.01); *B23K 35/26* (2013.01); *B23K 35/262* (2013.01); *B23K 35/286* (2013.01); *B23K 35/302* (2013.01); *B23K 35/325* (2013.01); *B23K 35/40* (2013.01); *B26F 1/02* (2013.01); *H05K 3/3478* (2013.01); *B23K 2201/42* (2013.01); *H05K 3/3484* (2013.01); *H05K 2201/10636* (2013.01); *H05K 2201/10992* (2013.01); *H05K 2203/0415* (2013.01); *H05K 2203/082* (2013.01); *Y02P 70/611* (2015.11); *Y10T 83/0448* (2015.04); *Y10T 83/0481* (2015.04)

(56) References Cited

U.S. PATENT DOCUMENTS

| | | | |
|---|---|---|---|
| 6,929,170 | B2 | 8/2005 | Ju |
| 7,533,793 | B2 | 5/2009 | Godijn et al. |
| 8,991,679 | B2 * | 3/2015 | Abe et al. ............. 228/56.3 |
| 2005/0067470 | A1 | 3/2005 | Ju |
| 2005/0184129 | A1 | 8/2005 | Godijn et al. |

FOREIGN PATENT DOCUMENTS

| | | |
|---|---|---|
| JP | 06-275944 | 9/1994 |
| JP | 06-283536 | 10/1994 |
| JP | 09-219580 | 8/1997 |

* cited by examiner

SOLDER PIECE, CHIP SOLDER AND METHOD OF FABRICATING SOLDER PIECE

TECHNICAL FIELD

The present invention relates to a solder piece that is used in a soldering process of electronic components mounted on a land on a substrate, a chip solder receiving the solder piece and a method of fabricating the solder piece.

BACKGROUND ART

A soldering technology in which by applying a solder paste to the land formed on the substrate, mounting the electronic components on the solder-paste-applied land of the substrate and melting the solder paste, the soldering is carried out has been conventionally used.

If a mechanical strength for fixation is required when mounting the electronic components using such a method, an amount of solder may be in short supply by only the solder paste applied to the land.

Thus, a technology for supplementing the solder by mounting a chipped solder, which is so called as "solder piece", on the land in addition to the solder paste has been proposed (see, for example, Patent Document 1).

PRIOR ART DOCUMENTS

Patent Document

Patent Document 1: Japanese Patent Application Publication No. H06-275944.

DISCLOSURE OF THE INVENTION

Problems to be Solved by the Invention

The solder piece is configured so as to become a desired shape by performing a punching process on a sheet member. The solder piece is fabricated by the punching process with a surface thereof including a curved surface, which is so called as "shear droop portion", being formed on a surface which is opposite to a surface pushed by a punch.

The solder piece thus fabricated is received in an opened concave portion formed in a long supply tape and then, a cover tape is sealed on it, which is then supplied. When mounting the solder piece on the substrate, the solder piece received in the open concave portion is sucked and maintained by a vacuum suction and is taken out of the supply tape after the cover tape has been removed, so that it is mounted on the substrate.

When, however, a surface on which the shear droop portion is formed becomes a sucked surface, it may be unable to maintain the solder piece by the suction so that a failure to supply the solder piece may occur.

The invention solves such a problem, and has as an object to provide a solder piece that prevents its surface on which the shear droop portion generated by the punching process is formed from becoming the sucked surface, a chip solder receiving the solder piece and a method of fabricating the solder piece.

Means for Solving the Problem

In order to solve the above-mentioned problem, the invention relates to a solder piece that is configured so as to be a rectangular parallelepiped shape by a punching process wherein of four surfaces of the rectangular parallelepiped excluding from surfaces thereof a surface on which the shear droop portion generated by the punching process is formed and a surface that is opposite to the surface on which the shear droop portion is formed, any one surface of at least two opposite surfaces thereof is a sucked surface.

The invention also relates to a chip solder which contains a solder piece that is configured so as to be a rectangular parallelepiped shape by a punching process and a supply tape in which an opened concave portion that receives the solder piece is formed, wherein of four surfaces of the rectangular parallelepiped excluding from surfaces thereof a surface on which the shear droop portion generated by the punching process is formed and a surface that is opposite to the surface on which the shear droop portion is formed, any one surface of at least two opposite surfaces thereof is a sucked surface, and wherein the open concave portion is configured so as to have a shape such that, of four surfaces of the rectangular parallelepiped excluding from the surfaces thereof the surface on which the shear droop portion is formed and the surface that is opposite to the surface on which the shear droop portion is formed, at least a surface which can be the sucked surface or a surface which is opposite to the surface that can be the sucked surface is exposed.

Further, the invention relates to a method of fabricating a solder piece that is configured so as to be a rectangular parallelepiped shape by a punching process wherein of four surfaces of the rectangular parallelepiped excluding from surfaces thereof a surface on which the shear droop portion generated by the punching process is formed and a surface that is opposite to the surface on which the shear droop portion is formed, any one surface of at least two opposite surfaces thereof is a sucked surface, the method comprising a step of punching a material with the four surfaces including a surface which can be the sucked surface being sheared surfaces.

According to the invention, the solder piece is configured so as to have a rectangular parallelepiped shape having six surfaces by a punching process. The solder piece is configured so that, of four surfaces of the rectangular parallelepiped excluding a surface on which the shear droop portion generated by the punching process is formed and a surface that is opposite to the surface on which the shear droop portion is formed, any one surface thereof is a sucked surface.

In the chip solder in which the solder piece is received in the supply tape, the solder piece is not received in the open concave portion with the surface on which the shear droop portion is formed being exposed but the solder piece is received therein with the surface which can be the sucked surface being exposed from the open concave portion.

EFFECTS OF THE INVENTION

By the invention, it is possible to prevent the surface on which the shear droop portion generated by the punching process is formed from becoming a sucked surface of the solder piece. This enables the solder piece to be securely sucked, thereby allowing an occurrence of the failure of suction to be avoided and allowing to be also avoided the failure to supply the solder piece accompanying the failure of suction.

BEST MODE FOR CARRYING OUT THE INVENTION

The following will describe an embodiment of a solder piece, a chip solder and a method of fabricating the solder piece according to the present invention with reference to drawings.

<Configuration Example of Solder Piece According to this Embodiment>

Figure 1:
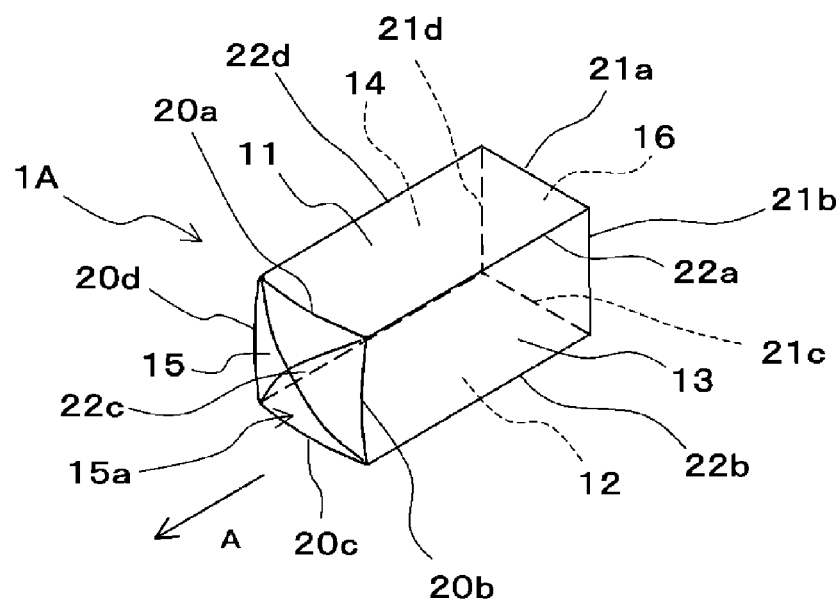
FIG. 1 is a perspective view of a solder piece according to this embodiment for showing an example thereof.
Figure 2:
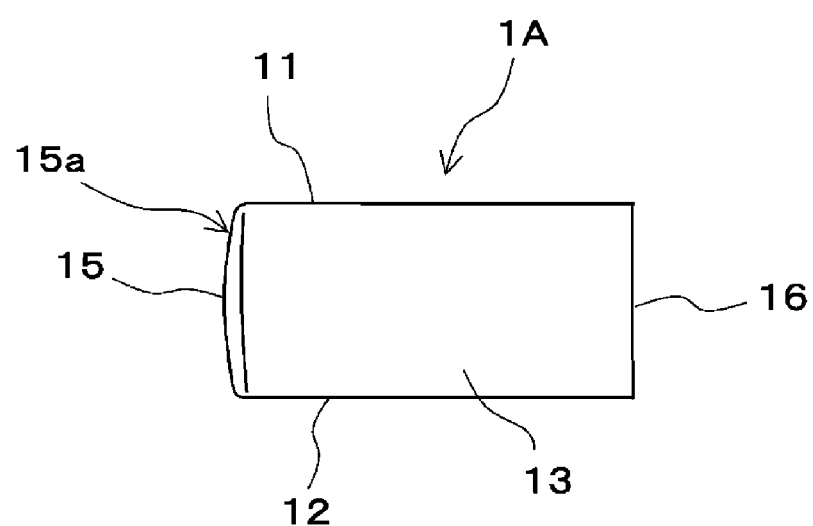
FIG. 2 is a side view of the solder piece according to this embodiment for showing the example thereof.

FIG. 1 is a perspective view of the solder piece according to this embodiment for showing an example thereof. FIG. 2 is a side view of the solder piece according to this embodiment for showing the example thereof.

The solder piece 1A according to this embodiment has a rectangular parallelepiped shape composed of six surfaces and is fabricated by a punching process in which a tape like sheet member is punched out. The solder piece 1A is provided with four surfaces or two surfaces which can be a sucked surface on the occasion of handling, in this embodiment, four surfaces of a first surface 11, a second surface 12, a third surface 13 and a fourth surface 14, a fifth surface 15 which is a surface on which a shear droop portion 15a generated by the punching process is formed and a sixth surface 16 that is opposite to the fifth surface 15.

The solder piece 1A is punched out in a direction shown in an arrow A with the first surface 11, the second surface 12, the third surface 13 and the fourth surface 14 being sheared surfaces. This enables the four surfaces thereof excluding the fifth surface 15 on which the shear droop portion 15a is formed and the sixth surface 16 that is opposite to the fifth surface 15 to be formed with desired size and precision.

Therefore, the solder piece 1A is configured so that of four surfaces of the first surface 11, the second surface 12, the third surface 13 and the fourth surface 14, any one surface of at least two opposite surfaces thereof is the sucked surface but the fifth surface 15 on which the shear droop portion 15a is formed is not a sucked surface.

In this embodiment, the solder piece 1A is formed with the fifth surface 15 and the sixth surface 16 being almost squares. A side 20a shared by the fifth surface 15 and the first surface 11, a side 20b shared by the fifth surface 15 and the second surface 12, a side 20c shared by the fifth surface 15 and the third surface 13 and a side 20d shared by the fifth surface 15 and the fourth surface 14 are configured so as to have the almost same length within a range which depends on the precision of a tool.

Further, the solder piece 1A is formed so that a side 21a shared by the sixth surface 16 and the first surface 11, a side 21b shared by the sixth surface 16 and the second surface 12, a side 21c shared by the sixth surface 15 and the third surface 13 and a side 21d shared by the sixth surface 16 and the fourth surface 14 have the almost same length. Each side of the fifth surface 15 has the almost same length as that of each side of the sixth surface 16.

The solder piece 1A is formed so that the first surface 11, the second surface 12, the third surface 13 and the fourth surface 14 have rectangular shapes. In the solder piece 1A, a side 22a shared by the first surface 11 and the second surface 12, a side 22b shared by the second surface 12 and the third surface 13, a side 22c shared by the third surface 13 and the fourth surface 14 and a side 22d shared by the fourth surface 14 and the first surface 11 are configured so as to have the length similar to each other based on a punching-out direction by the punching process. The solder piece 1A is formed so that the respective sides shared by the first surface 11, the second surface 12, the third surface 13 and the fourth surface 14 are longer than respective sides of the fifth surface 15 and the sixth surface 16.

Thus, in the solder piece 1A, since the fifth surface 15 and the sixth surface 16 are formed so as to be almost squares and the first surface 11, the second surface 12, the third surface 13 and the fourth surface 14 are formed so as to be rectangular, four surfaces of the first surface 11, the second surface 12, the third surface 13 and the fourth surface 14 have symmetry with respect to a plane around an axis passing through the fifth surface 15 and the sixth surface 16 as rotation axis. The solder piece 1A has a size of, as one example, 1.0 mm×0.5 mm×0.5 mm.

Accordingly, the solder piece 1A is formed with anyone surface of the first surface 11, the second surface 12, the third surface 13 and the fourth surface 14 being a sucked surface so that the first surface 11, the second surface 12, the third surface 13 and the fourth surface 14, which can be the sucked surface, are desired surfaces by which the solder piece 1A can be sucked using the vacuum suction.

<Configuration Example of Chip Solder According to this Embodiment>

Figure 3:
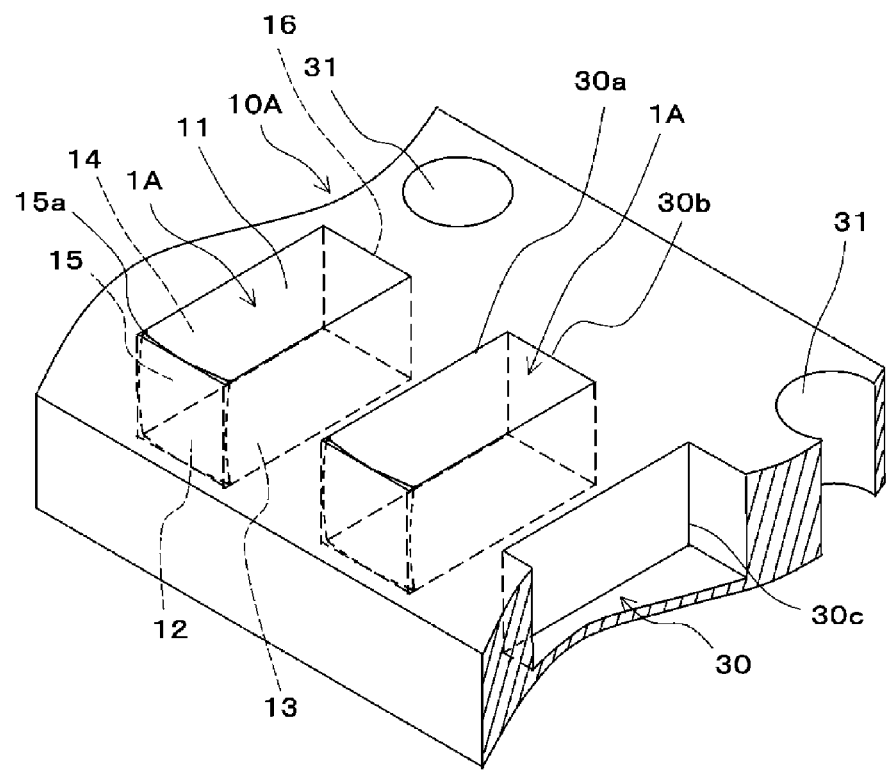
FIG. 3 is a perspective view of a chip solder according to this embodiment for showing an example thereof.

FIG. 3 is a perspective view of the chip solder according to this embodiment for showing an example thereof. The chip solder 10A according to this embodiment is provided with the solder piece 1A thus mentioned above and a supply tape 3 in which the solder piece is received. The supply tape 3 is made of any plastic materials, paper or the like and is formed so as to be long. Plural open concave portions 30, each of which is capable of receiving the solder piece 1A, are formed along an extending direction thereof. Further, the chip solder 10A has feeding holes 31 for allowing the supply tape 3 to be conveyed with them being formed along an extending direction thereof. The chip solder 10A is sealed by a cover tape, not shown, after the solder pieces 1A have been received in the open concave portions 30.

The open concave portions 30 are hollows in each of which its longitudinal side 30a has a length somewhat longer than that of each side shared by the first surface 11, the second surface 12, the third surface 13 and the fourth surface 14 in the solder piece 1A and its lateral side 30b has a length somewhat longer than that of each side of the fifth surface 15 and the sixth surface 16. The open concave portions 30 are hollows in each of which its depth side 30c has a depth somewhat deeper than the length of each side of the fifth surface 15 and the sixth surface 16.

Thus, the chip solder 10A is formed with one solder piece 1A being received in each of the opened concave portions 30 in the supply tape 3. The solder piece 1A is received therein with an optional posture such that any one surface of the first surface 11, the second surface 12, the third surface 13 and the fourth surface 14 is exposed from the open concave portion 30 on the axis passing through the fifth surface 15 and the sixth surface 16 as the rotation axis. On the other hand, the solder piece 1A is prevented from being received in the supply tape 3 under the posture such that any one of the fifth surface 15 on which the shear droop portion 15 is formed and the sixth surface 16 that is opposite to the fifth surface 15 is exposed from the open concave portions 30.

Here, if the solder piece has a regular hexahedron shape in which each surface is a square, it can be received in the supply tape even in a posture such that a surface on which the shear droop portion is formed is exposed from the open concave portions of the supply tape. Accordingly, the solder piece is configured so as to be a rectangular parallelepiped shape.

<Example of Use Condition of Solder Piece According to this Embodiment>

Figure 4A:
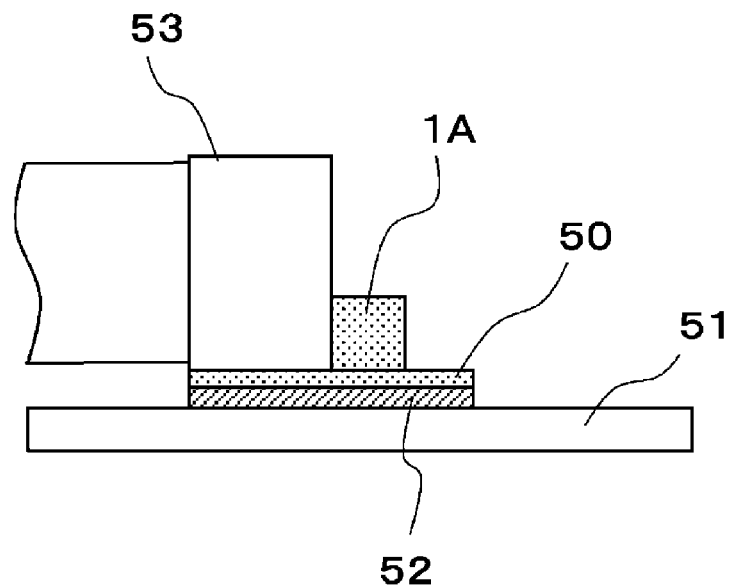
FIG. 4A is a diagram of the solder piece according to this embodiment for showing an example of use condition thereof.
Figure 4B:
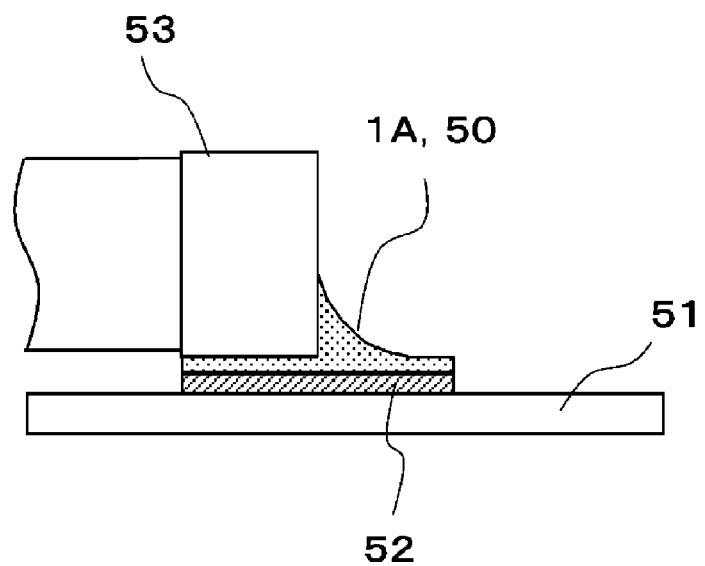
FIG. 4B is a diagram of the solder piece according to this embodiment for showing the example of use condition thereof.

FIGS. 4A and 4B are diagrams of the solder pieces according to this embodiment each showing an example of use condition thereof. As shown in FIG. 4A, the solder piece 1A is mounted together with an electronic component 53 on a land 52 of a substrate 51, to which a solder paste 50 is applied. In a step of mounting the solder piece 1A on the substrate 51, the solder piece 1A supplied in the form of a chip solder 10A is sucked by the vacuum suction and mounted on the predetermined land.

By putting the substrate 51 into a reflow furnace, not shown, and heating it, the solder paste 50 and the solder piece 1A are then melted together, as shown in FIG. 4B, which allows the electronic component 53 to be soldered.

The soldering using the solder piece 1A enables an amount of solder to be increased as compared with the soldering using only the solder paste, which allows to be improved a strength of a soldered portion in which any mechanical strength is required.

<Example of Method of fabricating Solder Piece According to this Embodiment>

Figure 5A:
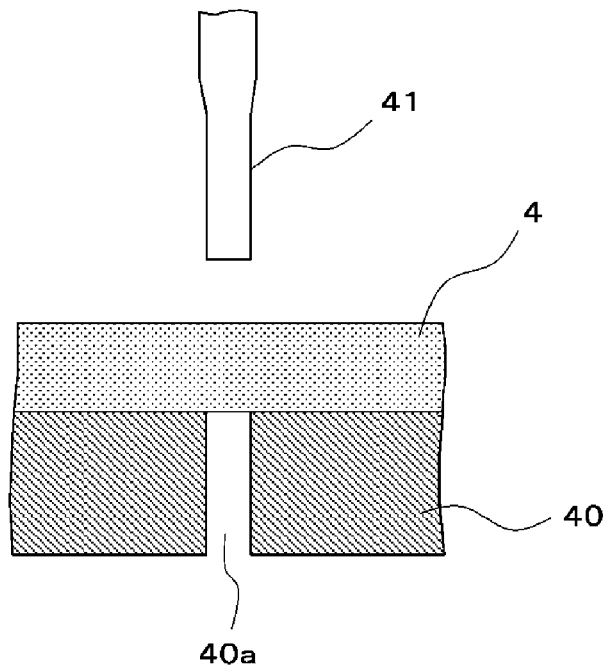
FIG. 5A is an operation diagram of a method of fabricating a solder piece according to this embodiment for showing an example thereof.
Figure 5B:
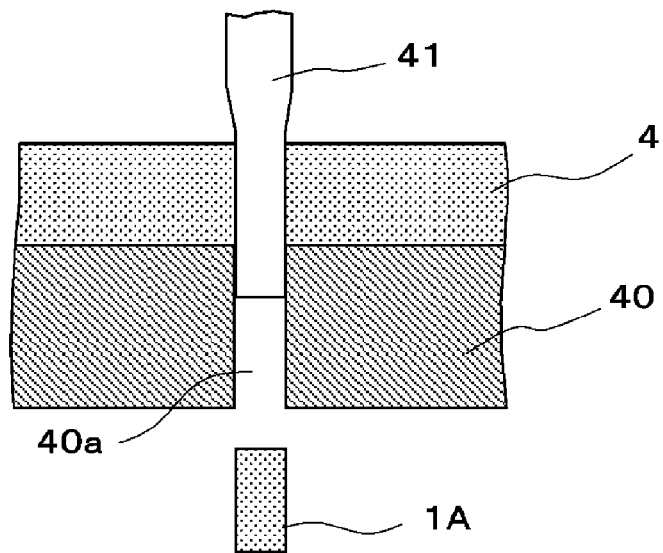
FIG. 5B is an operation diagram of the method of fabricating the solder piece according to this embodiment for showing the example thereof.

FIGS. 5A and 5B are operation diagrams of a method of fabricating the solder piece according to this embodiment for showing an example thereof. The following will then describe the method of fabricating the solder piece according to this embodiment with reference to the drawings. The solder piece 1A according to this embodiment is configured so as to have a rectangular parallelepiped shape by a punching process in which as shown in FIG. 5A, a calendered solder tape 4 which is a tape like sheet member that is configured so as to have a predetermined thickness is supplied to a die 40 and as shown FIG. 5B, a punch 41 punches out the calendered solder tape 4 in a longitudinal direction relative to the rectangular parallelepiped.

In the solder piece 1A, a punching direction in the punching process is set so that the first surface 11, the second surface 12, the third surface 13 and the fourth surface 14 are sheared surfaces. Thus, the calendered solder tape 4 has a thickness that is the same length as that of each side, for example, a length of the side 22a, shared by the first surface 11, the second surface 12, the third surface 13, and the fourth surface 14.

The punch 41 punching out the calendered solder tape 4 has a section of almost square in this embodiment in which a length of each of the four sides is configured so as to have the almost same length as that of each of the sides in the fifth surface 15 and the sixth surface 16 of the solder piece 1A.

The die 40 receiving the punch 41 is formed so as to have a passing-through hole 40a through which the solder piece 1A punched out by the punch 41 is passed. The passing-through hole 40a has an almost square section in this embodiment, four sides of which are respectively configured so as to have lengths somewhat longer than that of each side of the fifth surface 15 and the sixth surface 16 of the solder piece 1A. Thus, as shown in FIGS. 5A and 5B, the punching process takes place in a longitudinal direction with respect to the parallelepiped shape of the solder piece 1A.

In the solder piece 1A fabricated by the punching process, a precision of the first surface 11, the second surface 12, the third surface 13 and the fourth surface 14, which are sheared surfaces, is determined by a clearance between the punch 41 and the die 40 in the passing-through hole 40a. Accordingly, a size of each tool is set so that the first surface 11, the second surface 12, the third surface 13 and the fourth surface 14, which can be the sucked surface, become a desired level by which the solder piece 1A can be sucked using the vacuum suction.

<Example of Method of fabricating Chip Solder According to this Embodiment>

The following will then describe an example of the method of fabricating a chip solder according to this embodiment with reference to the drawings. The chip solder 10A according to this embodiment is configured so as to receive the solder piece 1A in the open concave portion 30 of the supply tape 3.

Based on the shape of each of the solder piece 1A and the shape of the open concave portion 30 of the supply tape 3, the solder pieces 1A may be received therein with any one of the first surface 11, the second surface 12, the third surface 13 and the fourth surface 14 being exposed from the open concave portion 30 even if their postures are unchanged and they do not stand in a row.

On the other hand, the solder piece 1A is prevented from being in the supply tape 3 with the fifth surface 15 on which the shear droop portion 15a is formed and the sixth surface that is opposite to the fifth surface 15 being exposed from the opened concave portion 30.

Accordingly, the chip solder 10A enables any one of the first surface 11, the second surface 12, the third surface 13 and the fourth surface 14, which are configured so as to be at a desired level at which the solder piece 1A can be sucked using the vacuum suction, to be a sucked surface, thereby enabling the solder piece 1A to be surely sucked. Further, the chip solder 10A prevents the fifth surface 15 of the solder piece 1A, on which the shear droop portion 15a that is unsuitable for the suction is formed, from being the sucked surface, thereby allowing an occurrence of the failure of suction to be avoided and allowing to be also avoided the failure to supply the solder piece 1A accompanying the failure of suction.

<Variation Example of Solder Piece According to this Embodiment>

Figure 6:
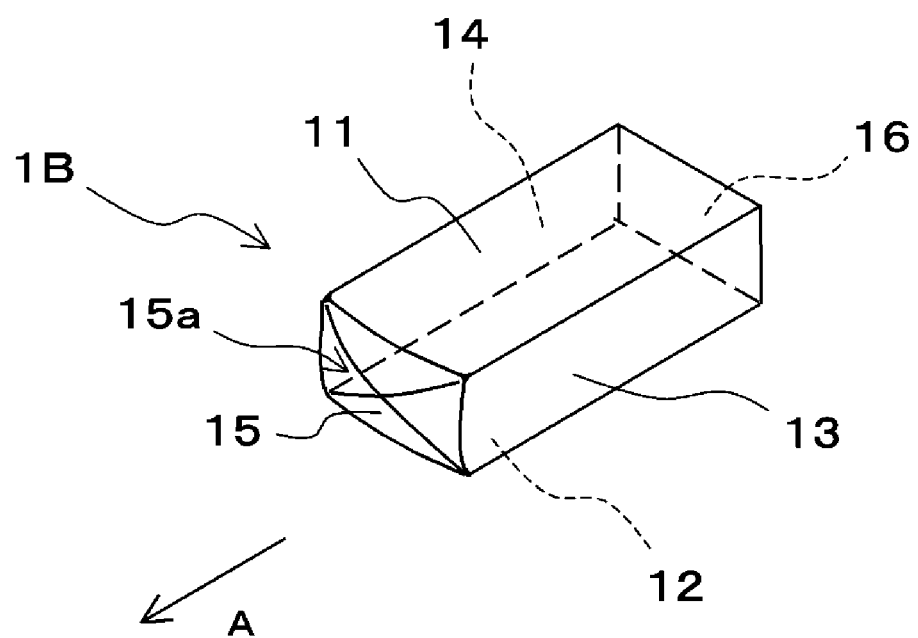
FIG. 6 is a perspective view of a solder piece according to this embodiment for showing a variation example thereof.

FIG. 6 is a perspective view of a solder piece according to this embodiment for showing a variation example thereof. The solder piece 1B of the variation example is configured with the fifth surface 15 on which the shear droop portion 15a is formed and the sixth surface that is opposite to the fifth surface 15 being rectangles. In the shape of the solder piece 1B of the variation example, for example, any one of the first surface 11, sides of which are shared by long sides of the fifth surface 15 and the sixth surface 16, and the second surface 12 that is opposite to the first surface 11 becomes a sucked surface. The solder piece 1B of the variation example has a size of, as one example, 2.6 mm×2.0 mm×0.5 mm.

INDUSTRIAL APPLICABILITY

This invention is applied to a method of supplementing the solder by mounting a solder piece on a land in addition to a solder paste.

DESCRIPTION OF CODES 1A, 1B . . . Solder Piece; 11 . . . First surface; 12 . . . Second Surface; 13 . . . Third Surface; 14 . . . Fourth Surface; 15 . . . Fifth Surface; 16 . . . Sixth Surface; 10A . . . Chip Solder; 3 . . . Supply Tape; 30 . . . Open Concave Portion.

The invention claimed is:

1. A method of manufacturing a chip solder comprising:
forming a solder piece by a punching process, including forming the solder piece in a rectangular parallelepiped shape with a first planar surface, a second planar surface opposite the first surface, a third planar surface, and a fourth planar surface opposite the third surface, forming a fifth surface on which a shear droop portion is generated by punching on a sixth surface opposite the fifth surface, thereby driving the solder piece in a direction toward the fifth surface, and wherein the first through fourth surfaces are sheared surfaces and any one of only the first through fourth surfaces is a vacuum pickup surface, but neither fifth surface nor the sixth surface is a vacuum pickup surface, and wherein a distance between the fifth and sixth surfaces is greater than a distance between the first and second surfaces and is greater than a distance between the third and fourth surfaces, and wherein the sixth surface has an area that is smaller than an area of each of the first through fourth surfaces,
providing a supply tape including an open cavity portion for receiving a solder piece, wherein the open cavity portion is rectangular and has a length sufficient to accommodate the distance between the fifth and sixth surfaces and has a width smaller than the distance between the fifth and sixth surfaces and yet sufficient to accommodate the distance between the third and fourth surfaces, whereby the solder piece can be received in the open cavity portion with the first surface exposed, and
placing the solder piece in the open cavity portion of the supply tape with a planar surface selected from only the first through fourth surfaces exposed to be available for vacuum pickup.

2. A chip solder comprising:
a solder piece that has a rectangular parallelepiped shape with a first surface, a second surface opposite the first surface, a third surface, a fourth surface opposite the third surface, a fifth surface including a shear droop portion generated by a punching process, and a sixth surface, opposite the fifth surface, the solder piece being formed by punching the sixth surface, in a longitudinal direction of the rectangular parallelepiped shaped solder piece toward the fifth surface, and wherein the first through fourth surfaces are sheared surfaces and planar, and wherein either one of the first and second surfaces is a vacuum pickup surface, but neither the fifth surface nor the sixth surface is a vacuum pickup surface, and wherein a distance between the fifth and sixth surfaces is greater than a distance between the first and second surfaces and is greater than a distance between the third and fourth surfaces, and wherein the sixth surface has an area that is smaller than an area of either of the first and second surfaces; and
a supply tape formed with an open cavity portion in which the solder piece is located, wherein the open cavity portion is rectangular and has a length that is greater than the distance between the fifth and sixth surfaces and has a width that is greater than the distance between the third and fourth surfaces and is smaller than the distance between the fifth and sixth surfaces, and wherein the solder piece is located in the open cavity portion with one of only the first through fourth surfaces exposed to be a vacuum pickup surface.

3. The chip solder according to claim 2, wherein the distance between the third and fourth surfaces of the solder piece is greater than the distance between the first and second surfaces, and the width of the open cavity portion accommodates the distance between the third and fourth surfaces, and wherein the solder piece is located in the open cavity portion with one of only the first and second surfaces exposed.

* * * * *